United States Patent [19]
Koezuka et al.

[11] Patent Number: 5,107,308
[45] Date of Patent: Apr. 21, 1992

[54] FIELD-EFFECT TRANSISTOR

[75] Inventors: Hiroshi Koezuka; Akira Tsumura; Torahiko Ando, all of Amagasaki, Japan

[73] Assignee: Mitsubishi Denki Kabushiki Kaisha, Japan

[21] Appl. No.: 67,126

[22] Filed: Jun. 29, 1987

[30] Foreign Application Priority Data

Jul. 4, 1986 [JP] Japan .................... 61-158544
Jul. 4, 1986 [JP] Japan .................... 61-158545

[51] Int. Cl.$^5$ ............................ H01L 29/28
[52] U.S. Cl. ........................ 357/8; 357/23.2
[58] Field of Search ................ 357/8, 23.2

[56] References Cited

U.S. PATENT DOCUMENTS 4,663,001 5/1987 Lazzaroni et al. ............ 204/78
4,873,556 10/1989 Hyodo et al. ................ 357/8 X

OTHER PUBLICATIONS

Koezuka et al., "Organic Heterojunctions . . . Junctions", J. Appl. Phys. 58(3), Aug. 1, 1985, pp. 1279-1284.
Chiang et al., "Polyacetylene . . . and Compensation", Appl. Phys. Lett. 33(1), Jul. 1, 1978, pp. 18-20.
F. Ebisawa et al., "Electricl Properties of Polyacetylene/Polysiloxane Interface", J. Appl. Phys. 54(6), Jun. 1983, pp. 3255-3259.
A. Tsumura et al., "Macromolecular Electronic Device: Field-Effect Transistor with a Polythiophene Thin Film", Appl. Phys. Lett. 49(18), Nov. 3, 1986, pp. 1210-1212.
A. Tsumura et al., "Chemically Prepared Poly(N-Methylpyrrole) Thin Film, Its Application to the Field Effect Transistor", Chemistry Letters, pp. 863-866, 1986.
H. Koezuka et al., "Field-Effect Transistor with Polythiophene Thin Film", Abstract of International Conference on Science & Technology of Synthetic Metals, Jun. 1-6, 1986, p. 391.

Primary Examiner—Andrew J. James
Assistant Examiner—Sara W. Crane
Attorney, Agent, or Firm—Leydig, Voit & Mayer

[57] ABSTRACT

A film of a first $\pi$-conjugated polymer is used as at least one of the source and the drain of a field-effect transistor, and a film of a second $\pi$-conjugated polymer which differs from the first $\pi$-conjugated polymer is used as a semiconductor layer in the field-effect transistor.

35 Claims, 6 Drawing Sheets

FIELD-EFFECT TRANSISTOR

BACKGROUND OF THE INVENTION

This invention relates to a field-effect transistor (abbreviated as FET) which employs an organic semiconductor. More particularly, it relates to a field-effect transistor for use as a switching device or as part of a drive circuit for a large-area liquid crystal display.

A π-conjugated polymer has a structural skeleton consisting of conjugated double bonds or conjugated triple bonds. It is thought that it has a band structure consisting of a valence band formed by overlapping π-electron orbits, a conduction band, and a forbidden band which separates the two. The width of the forbidden band varies depending on the material, but in most π-conjugated polymers, it is 1.5–4 eV. For this reason, many π-conjugated polymers are inherently electrical insulators. However, if so-called doping is performed in which electrons are removed from the valence band (resulting in oxidation) by chemical, electrochemical, or physical methods, or electrons are injected into the conduction band (resulting in reduction), it is thought that carriers which carry electrical charge are formed. As a result, by controlling the amount of doping, the electrical conductivity of a π-conjugated polymer can be varied over a wide range from that of an electrical insulator to that of a metal. When doping is performed by oxidation, a p-type π-conjugated polymer is obtained, and when doping is performed by reduction, an n-type π-conjugated polymer is obtained. This process is analogous to the introduction of impurities into an inorganic semiconductor. Thus, by means of the above-described doping process, a semiconductor device using a π-conjugated polymer as a semiconductor material can be manufactured.

A Schottky junction employing polyacetylene (Journal of Applied Physics, Volume 52, page 869, 1981; Japanese Patent Application Laid-Open No. 56-147486) and a Schottky junction employing a polypyrrole-type conjugated polymer (Japanese Patent Application Laid-Open No. 59-63760) are known. Also, a heterojunction element which is a combination of the inorganic semiconductor n-CdS and p-type polyacetylene has been reported (Journal of Applied Physics, Volume 51, page 4252, 1980). A junction which is a combination of two π-conjugated polymers has been reported in the form of a p-n homo-junction employing p-type and n-type polyacetylene (Applied Physics Letters, Volume. 33, page 18, 1978). Furthermore, a heterojunction made from polyacetylene and poly(N-methylpyrrole) has been reported (Journal of Applied Physics, Volume 58, page 1279, 1985).

An FET employing a π-conjugated polymer as a semiconductor layer was disclosed in the Journal of Applied Physics, Volume 54, page 3255, 1983 (using polyacetylene) and in Polymer Preprints, Japan, Volume 34, No. 4, page 917, 1985 (using poly(N-methylpyrrole)).

FIG. 1 is a cross-sectional view of a conventional FET employing polyacetylene as a semiconductor layer. In the figure, a gate 2 in the form of an aluminum layer or the like is formed on a substrate 1 made of glass or the like. An electrically-insulating film 3 comprising polysiloxane is formed on the substrate 1 so as to cover the gate 2. A semiconductor layer 4 which is made of polyacetylene is formed atop the electrically-insulating film 3, and a source 5 and a drain 6 in the form of gold films are formed atop the semiconductor layer 4 on both ends thereof.

The operation of the illustrated FET is as follows. When a voltage is applied between the source 5 and the drain 6, a current flows between the source 5 and the drain 6 through the polyacetylene semiconductor layer 4. If at this time a voltage is applied to the gate 2, the conductance of the semiconductor layer 4 can be slightly changed by the field effect. Accordingly, the source-drain current can be controlled. It is thought that the reason for this phenomenon is that the width of the depletion layer within the polyacetylene semiconductor layer 4 is changed in accordance with the voltage which is applied to the gate 2, and the effective channel cross-sectional area of holes is changed.

However, this type of FET has the problem that the polyacetylene which forms the semiconductor layer is subject to sudden degradation due to oxygen and moisture in the air, and therefore it has extremely poor stability.

FIG. 2 is a cross-sectional view of another type of conventional FET which employs poly(N-methylpyrrole) as a semiconductor layer. In this figure, an electrically-insulating film 3 comprising silicon dioxide is formed on a p-type silicon wafer 7 which serves as both a substrate and a gate. Two gold films, which serve as a source 5 and a drain 6 and are separated from each other are formed atop the electrically-insulating film 3 thereof. The source 5 and the drain 6 and the surface of the electrically-insulating film 3 therebetween are covered by a semiconductor layer 4 in the form of a poly(N-methylpyrrole) film. In the same manner as for the FET of FIG. 1, the current which flows between the source 5 and the drain 6 through the semiconductor layer 4 can be controlled by the voltage which is applied to the gate 7, which controls the conductance of applied to the semiconductor layer 4.

However, in an FET which employs a π-conjugated polymer such as polyacetylene or poly(N-methylpyrrole) only as a semiconductor layer, only a moderate variation in the conductance between the source and the drain can be achieved by changing the gate voltage, and there is accordingly a need for an FET having improved characteristics.

SUMMARY OF THE INVENTION

Therefore, it is the object of the present invention to provide a field-effect transistor which has excellent electrical characteristics, which operates in a stable manner, and with which it is possible to greatly vary the source-drain conductance by changing the gate voltage thereof.

In the present invention, at least one applied to of the source and the drain of a field-effect transistor is a film of a first π-conjugated polymer, and the semiconductor layer is a film of a second π-conjugated polymer which differs from the first π-conjugated polymer. As a result, the field-effect transistor has operating characteristics which are greatly superior to those of a conventional field-effect transistor.

In accordance with one aspect of the present invention, a field-effect transistor comprises a source, a drain, a semiconductor layer which is disposed adjacent to the source and the drain and which serves as a current pathway therebetween, an electrically-insulating film which is disposed adjacent to the source, the drain, and the semiconductor layer, and a gate which is disposed on the opposite side of the electrically-insulating film from the semiconductor layer, the conductance of the semiconductor layer being controlled by the voltage of applied to the gate, wherein at least one of the source and the drain comprises a film of a first π-conjugated polymer, and the semiconductor layer comprises a film of a second π-conjugated polymer which differs from the first π-conjugated polymer.

In accordance with another aspect of the present invention, a field-effect transistor comprises a source, a drain, a semiconductor layer which is disposed adjacent to the source and the drain and which serves as a current pathway therebetween, an electrically-insulating film which is disposed adjacent to the source, the drain, and the semiconductor layer, and a gate which is disposed on the opposite side of the electrically-insulating film from the semiconductor layer, the conductance of the semiconductor layer being controlled by the voltage applied to the gate, wherein the source comprises a film of a first π-conjugated polymer, the semiconductor layer comprises a film of a second π-conjugated polymer which differs from the first π-conjugated polymer, and the drain comprises a film of a third π-conjugated polymer which differs from the second π-conjugated polymer.

BRIEF DESCRIPTION OF THE DRAWINGS

The present invention will become more readily apparent from the following description of a number of preferred embodiments of the invention when considered in conjunction with the accompanying drawings, of which.

In the figures, the same reference numerals indicate the same or corresponding parts.

DESCRIPTION OF THE PREFERRED EMBODIMENTS

Figure 3:
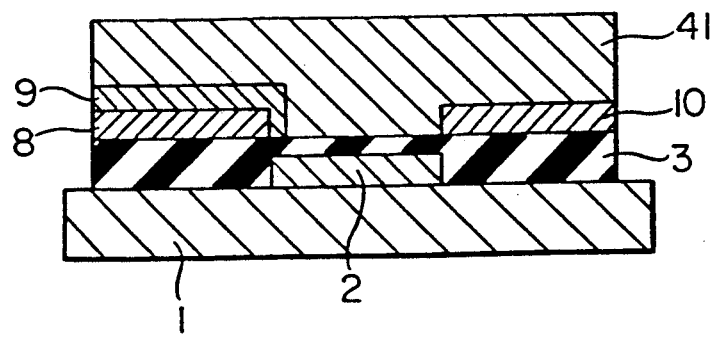
FIG. 3 is a cross-sectional view of one embodiment of a field-effect transistor in accordance with the present invention.

FIG. 3 is a cross-sectional view of an embodiment of a field-effect transistor in accordance with the present invention. As shown in FIG. 3, a metal film which functions as a gate 2 whose voltage controls the conductance of a semiconductor layer 41 is provided on a substrate 1 which is formed of an electrically-insulating material. An electrically-insulating film 3 which covers the gate 2 is formed on the substrate 1. A film of a first π-conjugated polymer which functions as a source 9 and a metal film which functions as a drain 10 are provided apart from each other atop the electrically-insulating film 3 thereof. A metal film 8 which serves as a lead for the source 9 is disposed between source 9 and the electrically-insulating film 3. The above-mentioned semiconductor layer 41 covers the source 9, the drain 10, and the upper surface of the electrically-insulating film 3 therebetween. The semiconductor layer 41 is formed of a second π-conjugated polymer which differs from the first π-conjugated polymer. In the present embodiment, element 9 is used as a source and element 10 is used as a drain, but it is also possible for element 9 to be used as a drain and for element number 10 to be used as a source, in which case the metal film 8 serves as a lead for the drain.

Figure 4:
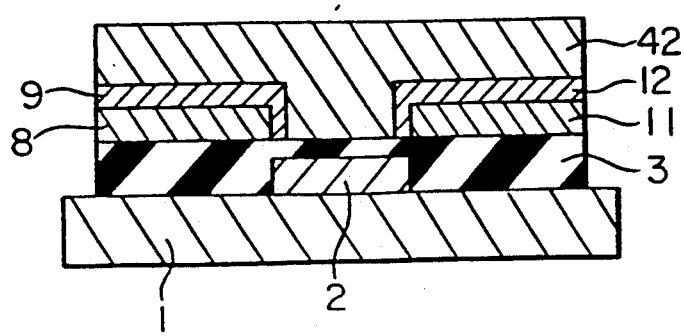
FIG. 4 is a cross-sectional view of another embodiment of a field-effect transistor in accordance with the present invention.

FIG. 4 is a cross-sectional view of another embodiment of a field-effect transistor in accordance with the present invention. In this embodiment a source 9 and a drain 12 are formed apart from each other atop an electrically-insulating film 3. The source 9 comprises a film of a first π-conjugated polymer, and the drain 12 comprises a film of a third π-conjugated polymer. Two metal films 8 and 11 which serve as leads are sandwiched between the insulating film 3 and the source 9 and the drain 12, respectively. A semiconductor layer 42 is formed atop the source 9, the electrically-insulating film 3 and between the drain 12 and the electrically-insulating film 3, and the upper surface of the electrically-insulating film 3 therebetween. The semiconductor layer 42 is made of a second π-conjugated polymer which differs from the first and third π-conjugated polymers.

The substrate 1 can be made of any electrically-insulating material. Some specific examples are glass, sintered alumina, polyimide film, polyester film, and other electrically-insulating plastics. Some examples of a metal which can be used for the metal film which serves as a gate 2 and for metal films 8, 10, and 11 are gold, platinum, chromium, palladium, aluminum, indium, tin oxides, indium oxide, and indium-tin oxides (ITO). Of course, other metals can be used as well, and it is also possible to employ two or more such metals. The metal films can be applied by vapor deposition, sputtering, plating, CVD growth techniques, or other suitable method.

From the standpoint of practicality, it is desirable that metal films 8, 10, and 11 be in ohmic contact with the π-conjugated polymer films 9, 12, and 41.

In the present invention, p-type silicon or n-type silicon can be used for both the gate 2 and the substrate 1. In this case, the substrate 1 can be omitted. If p-type or n-type silicon is used, it is desirable from the standpoint of practicality that the volume resistivity of the p-type or n-type silicon be less than that of the π-conjugated polymer film which is used as the semiconductor layer. It is also possible to use an electrically-conductive organic polymer as the gate. For some applications, it may be suitable to combine the gate 2 and the substrate 1 and to employ a metal plate made of stainless steel, copper, or the like therefor.

As the electrically-insulating film 3, any electrically-insulating material can be used, whether organic or inorganic. Some common examples are silicon dioxide (SiO$_2$), silicon nitride, aluminum oxide, polyethylene, polyvinylcarbazole, polyphenylenesulfide, and polyparaxylene. The electrically-insulating film 3 can be formed by CVD, plasma CVD, vapor deposition, spin coating, cluster ion beam vapor deposition, or other methods. The LB method for building up monomolecular films can also be used. When p-type or n-type silicon is used for both the gate 2 and the substrate 1, it is preferable to use a silicon dioxide film formed by thermal oxidation of silicon as the electrically-insulating film 3.

Any π-conjugated polymer can be used for the π-conjugated polymer films of the present invention. Some specific examples are polypyrrole, poly(N-substituted pyrrole), poly(3,4-disubstituted pyrrole), polythiophene, poly(3-substituted thiophene), poly(3,4- disubstituted thiophene), polyaniline, polyazulene, polypyrene, polycarbazole, poly(N-substituted carbazole), polyselenophene, polyfuran, polybenzothiophene, poly(phenylenevinylene), polybenzofuran, poly(paraphenylene), polyindole, polyisothionaphthene, polypyridazine, polydiacetylenes, and graphite polymers. Many other substances may also be used. However, from the standpoint of the properties of the resulting FET, film formability, and ease of synthesis, it is preferable that the π-conjugated polymer comprise five-membered heterocyclic rings whose formula is given by

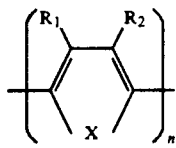

wherein X is S or O, R1 and R2 are each selected from —H, —CH₃, —OCH₃, —C₂H₅, and —OC₂H₅, and n is an integer, or heterocyclic rings whose formula is given by

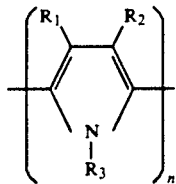

wherein R1 and R2 are selected from —H, —CH₃, —OCH₃, —C₂H₅, and —OC₂H₅, R3 is selected from —H, —CH₃, —C₂H₅, —C₃H₇,

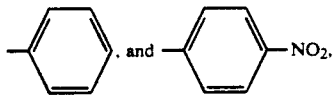

and n is an integer. From the standpoint of practicality, polythiophene, poly(3-methylthiophene), polypyrrole, and poly(N-methylpyrrole) are particularly suitable.

The π-conjugated polymer films can be formed by a method such as spin coating, vapor deposition, or dipping of a π-conjugated polymer which is synthesized by a conventional polymer synthesis method. Alternatively, it can be formed by previously coating a surface with a catalyst and introducing a monomer gas, by CVD, phot CVD, chemical oxidation polymerization, electrochemical polymerization, or other methods. Furthermore, the LB method can be used in which a monomer is spread on a subphase of water, glycerin, or the like to form a monomer film or a built-up film, and deposition is performed on the substrate. At this time, a π-conjugated polymer film can be obtained using a method in which polymerization is carried out prior to deposition on the substrate, or a method in which polymerization is performed after deposition. However, from the standpoints of film formability, ease of manufacture, and the like, electrochemical polymerization is preferable.

A π-conjugated polymer has a low electrical conductance even if doping is not performed, but in general it has the properties of a p-type semiconductor. However, doping is often carried out to improve the properties of field-effect transistors. Doping can be performed by chemical methods or physical methods. (See "Kogyo Zairyo" ("Industrial Materials"), Volume 34, No. 4, page 55, 1986). Chemical doping methods include (i) doping from a gas phase, (ii) doping from a liquid phase, (iii) electrochemical doping, and (iv) light-initiated doping. Physical doping consists of ion implantation. Any of the above methods can be employed. However, from the standpoints of ease of operation and controllability of doping, electrochemical doping is preferable. Moreover, electrochemical doping has the advantage that if the π-conjugated polymer film is formed by electrochemical polymerization, the amount of doping after polymerization can be controlled using the same apparatus used for polymerization.

One example of a method of forming a π-conjugated polymer film by electrochemical polymerization will now be described. In electrochemical polymerization, a monomer corresponding to the π-conjugated polymer and a supporting electrolyte are dissolved in an organic solvent, water, or a mixed solvent comprising an organic solvent and water to form a reaction solution. The metal film 8 of the FET illustrated in FIG. 3 which serves as a lead for a source or a drain is used as a working electrode, and a platinum plate or the like is used as a counter electrode. A current is passed between the working electrode and the counter electrode to cause a polymerization reaction, and a π-conjugated polymer film 9 which serves as a source or a drain is deposited on the metal film 8.

Next, using a reaction solution containing a supporting electrolyte and a monomer corresponding to another π-conjugated polymer which differs from that of the π-conjugated polymer film 9, electrochemical polymerization is performed using at least one of the π-conjugated polymer film 9 and the metal film 10 as a working electrode, whereby a π-conjugated polymer film 41 is formed on π-conjugated polymer film 9, on the metal film 10, and on the portion of the electrically-insulating film 3 therebetween. The π-conjugated films which are formed by electrochemical polymerization are generally doped by the anions of the supporting electrolyte, and therefore the amount of doping can be controlled so as to obtain an FET having superior properties. In general, at least one of the π-conjugated polymer films 9 and 41 is doped in order to improve the properties of the FET. The doping method which is employed can be selected from those described above in accordance with the structure of the FET.

Any organic solvent which can dissolve the supporting electrolyte and the monomer can be used for the above-described electrochemical polymerization. Some examples are polar solvents such as acetonitrile, nitrobenzene, benzonitrile, nitromethane, N,N-dimethyl formamide (DMF), dimethyl sulfoxide (DMSO), dichloromethane, tetrahydrofuran, ethyl alcohol, and methyl alcohol. These solvents can be used alone or in the form of a mixed solvent consisting of two or more solvents. The supporting electrolyte should be a substance which has a high oxidizing potential and reducing potential, which does not itself undergo oxidation or reduction during electrolytic polymerization, and which by dissolving in the solvent imparts electrical conductivity to the solution. Some examples of a supporting electrolyte which can be used are tetraalkylammonium perchlorate, tetraalkylammonium tetrafluoroborate salt, tetraalkylammonium hexafluorophosphate salt, tetraalkylammonium paratoluenesulfonate salt, and sodium hydroxide. They can be used alone, or two or more can be used in combination.

Although the above description concerns the case in which both of the π-conjugated polymer films of an FET having the structure shown in FIG. 3 are formed by electrochemical polymerization, depending on the structure of the FET, a different film-forming method can be employed, or electrochemical polymerization can be used in combination with some other film-forming method. The resulting FET of the present invention is useful as a switching device or as a portion of a drive circuit for a large-area liquid crystal display.

If the thickness of the π-conjugated polymer film which is used as a semiconductor layer is decreased, the source-drain current can be made small when the gate voltage is 0 volts. Namely, when using the FET in accordance with the present invention as a switching device, when the gate voltage is 0 volts, restricting the source-drain current to a small value means that the leakage current is made small, which is desirable.

Hereinbelow, the present invention will be described in further detail by means of a number of examples, which are presented merely for the purpose of illustration and do not limit the invention in any way. In each of the examples and comparative examples, the field effect transistors which were fabricated had a channel length of 6 microns and a channel width of 2 mm.

EXAMPLE 1

A silicon dioxide film having a thickness of roughly 3000 angstroms was formed by thermal oxidation on both sides of an n-type silicon wafer (3.0 cm×3.0 cm) having a thickness of 380 microns and an electrical conductance of 6 S/cm. Next, using a positive photoresist, two patterns for forming metal films, one of which would serve as a source or a drain, and the other of which would serve as a lead for a drain or a source, were drawn on one side of the silicon wafer (effective size of each pattern: 0.2 cm×0.8 cm, distance between patterns: 6 microns). A 200-angstrom chromium film was formed on the same side of the wafer as the patterns, and a 300-angstrom gold film was formed atop the chromium fil, both by vacuum deposition. The resist was then removed, and two gold films were formed, one of which would serve as a drain or a lead for a source, and the other of which would serve as a source or a lead for a drain. A lead was connected to each gold film using silver paste, and the contact portions were secured with an epoxy resin, thereby obtaining an FET substrate.

Electrolytes (0.7 g) in the form of tetramethylammonium p-toluenesulfonate were added to 100 ml of acetonitrile, and ventilation was performed with nitrogen gas for approximately 40 minutes. After the electrolytes were completely dissolved, 0.4 ml of pyrrole were added to obtain a reaction solution. A working electrode comprising one of the gold films formed on the above-described silicon wafer, a counter electrode in the form of a platinum plate (1 cm×2 cm), and a reference electrode in the form of a saturated calomel electrode (SCE) were immersed in the reaction solution. Under a nitrogen gas stream, a constant current of 30 microamperes was passed between working electrode, which served as an anode, and the counter electrode for 6 minutes. A polypyrrole film (approximately 4200 angstoms thick) which would become a source or drain was deposited on the working electrode only. After synthesis, the substrate was left to stand in an open circuit state for approximately 15 minutes and then was removed from the reaction solution. It was then washed two times with acetonitrile which had previously been deoxidized, was dried by blowing nitrogen gas thereon, and then was stored in a vacuum.

Electrolytes in the form of tetraethylammonium perchlorate (0.7 g) and 2,2′-bithiophene (0.4 g) were dissolved in 100 ml of acetonitrile, after which ventilation was performed under a nitrogen gas stream for approximately 30 minutes to obtain a reaction solution. A counter electrode in the form of a platinum plate (1 cm×2 cm), a reference electrode in the form of an SCE, and the substrate having polypyrrole deposited thereon which was prepared in the previous step were immersed in the reaction solution. The polypyrrole film and the gold film were simultaneously used as working electrodes. Under a nitrogen gas stream, first a voltage of 1 volt with respect to the SCE was applied to the working electrodes for 1 minute using a potentiostat. Then, a constant current (30 microamperes) was passed between the working electrodes, which served as anodes, and the counter electrode for 5 minutes, and a semiconductor layer in the form of a polythiophene film (approximately 850 angstroms thick) was deposited on the polypyrrole film, on the gold film, and on the silicon dioxide therebetween.

Next, using a potentiostat, the potential of the working electrodes was maintained at 0 volts with respect to the SCE for 4 hours, and the amount of doping of the polypyrrole film and the polythiophene film was adjusted. Then, the substrate was washed two times with acetonitrile which had previously been deoxidized, was dried by blowing nitrogen gas thereon, and was then completely dried in a vacuum.

A portion (approximately 0.5 square cm) of the silicon dioxide on the opposite side of the silicon wafer, which did not have a polypyrrole or a polythiophene film deposited thereon, was removed using sand paper. Ohmic contact was formed with the n-type silicon using an indium-gallium alloy, a lead was connected to this contact point, the contact was secured using an epoxy resin, and the n-type silicon was made to function as a gate through this lead.

In the above manner, an example of an FET having the structure shown in FIG. 3 was fabricated. In this example, the n-type silicon served as a combined substrate and gate and corresponded to elements numbers 1 and 2 of FIG. 3. The silicon dixode film corresponded to the electrically-insulating film 3, the polythiophene film corresponded to the semiconductor layer 41, the polypyrrole film corresponded to element number 9 and served as a source or drain, one of the chromium films on which a gold film was formed corresponded to the lead 8, and the other chromium film on which a gold film was formed corresponded to the metal layer 10 which served as a drain or source.

COMPARATIVE EXAMPLE 1

A silicon dioxide film having a thickness of roughly 3000 angstroms was formed by thermal oxidation on both sides of an n-type silicon wafer (3.0cm×3.0cm) having a thickness of 380 microns and an electrical conductance of 6 S/cm. Next, using a positive photoresist, two patterns for forming metal films which would serve as a drain and a source were drawn on one side of the silicon wafer (effective size of each pattern:

0.2cm×0.8cm, distance between patterns: 6 microns). A 200-angstrom chromium film was formed on the same side of the wafer, and a 300-angstrom gold film was formed atop the chromium film, both by vacuum deposition. The resist was then removed, and two gold films were formed, which would serve as a source and a drain. A lead was connected to each gold film using silver paste, and the contact portions were secured with an epoxy resin, thereby obtaining an FET substrate.

0.7 g of tetraethylammonium perchlorate and 0.4 g of 2,2'-bithiophene were added to 100 ml of acetonitrile, and ventilation was performed with nitrogen gas for 30 minutes to obtain a reaction solution. A counter electrode in the form of a platinum plate (1cm×2cm), a reference electrode in the form of an SCE, and the substrate which was prepared in the previous step were immersed in the reaction solution. The gold films both served as working electrodes. The working electrodes were made anodes, and a constant current of 30 microamperes was passed between the working electrodes and the counter electrode for 5 minutes. A polythiophene film (approximately 850 angstroms thick) was deposited on both gold films as well as on the silicon dioxide therebetween. Next, using a potentiostat, the potential of the working electrodes was maintained at 0 volts with respect to the SCE for 4 hours, and the amount of doping of the polythiophene was adjusted. Next, the silicon wafer was washed two times with deoxidized acetonitrile, was dried by blowing nitrogen gas thereon, and was then completely dried in a vacuum. Thereafter, in the same manner as in Example 1, the n-type silicon was processed so as to function as a gate.

Figure 1:
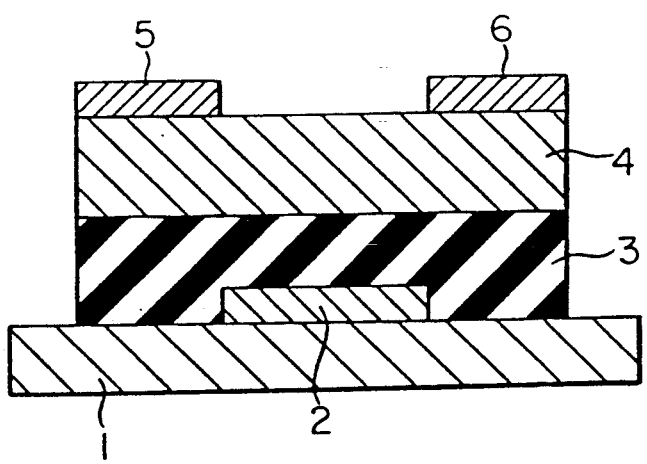
FIGS. 1 and 2 are cross-sectional views of conventional field-effect transistors.
Figure 2:
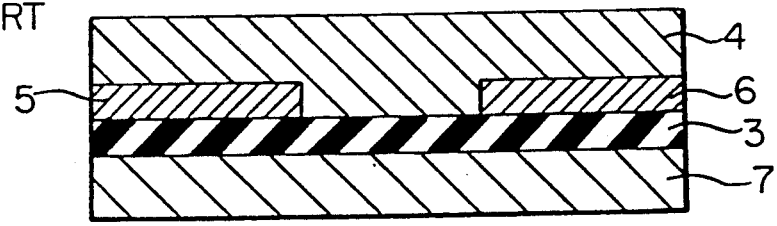

In the above manner, a comparative example of an FET having the structure illustrated in FIG. 2 was obtained. In this comparative example, the n-type silicon corresponded to the combined substrate and gate 7 of FIG. 2, the silicon dioxide film corresponded to the electrically-insulating film 3, the polythiophene film corresponded to the semiconductor layer 4, and the two chromium films which were covered with gold films corresponded to the source 5 and the drain 6.

Figure 5:
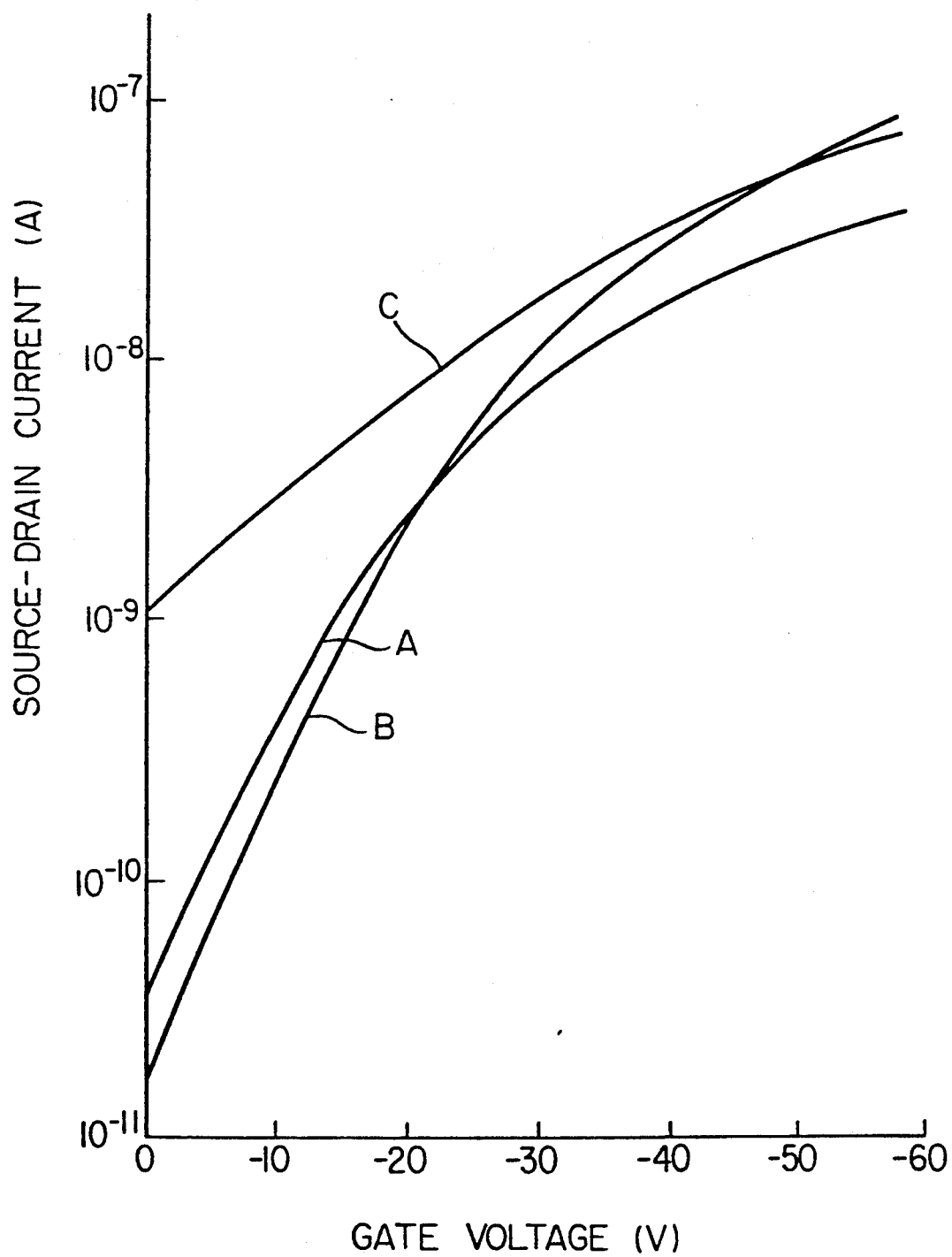
FIGS. 5 through 9 are graphs illustrating the relationship between the source-drain current and the gate voltage for embodiments of the present invention and for comparative examples.

FIG. 5 is a graph showing the relationship between the source-drain current and the gate voltage for Example 1 and Comparative Example 1 of a field-effect transistor when −30 volts were applied between the source and the drain. The horizontal axis indicates the gate voltage (V) and the vertical axis indicates the source-drain current (A). In FIG. 5, A is the curve for Example 1 of an FET when the polypyrrole film was used as a drain, B is the curve for Example 1 when the polypyrrole film was used as a source, and C is the curve for Comparative

EXAMPLE 1

As is clear from FIG. 5, the source-drain voltage can be much more greatly varied by the voltage applied to the gate for Example 1 than for Comparative Example 1, and a great improvement in characteristics is observed. Furthermore, when Example 1 was left in air for one month, no degradation was observed, nor was any observed when it was heated in air at 80° C.

EXAMPLE 2

An FET substrate was prepared in exactly the same manner as in Example 1. Electrolytes (0.7 g) in the form of tetramethylammonium p-toluenesulfonate were added to 100 ml of acetonitrile, and ventilation with nitrogen gas was performed for 40 minutes. After the electrolytes were completely dissolved, 0.4 ml of pyrrole were added to obtain a reaction solution. A counter electrode in the form of a platinum plate (1cm×2cm), a reference electrode in the form of an SCE, and the silicon wafer were immersed in the reaction solution, one of the gold films on the silicon wafer serving as a working electrode. While the reaction solution was cooled in ice water, under a stream of nitrogen gas, a constant current of 30 microamperes was passed between working electrode (which served as an anode) and the counter electrode for 7 minutes, and a polypyrrole film (approximately 5000 angstoms thick) which would become a source or drain was deposited on the working electrode only. After synthesis, the substrate was left to stand in an open circuit state for approximately 15 minutes and then was removed from the reaction solution. It was then washed two times with acetonitrile which had previously been deoxidized, was dried by blowing nitrogen gas thereon, and then was stored in a vacuum.

Electrolytes in the form of tetraethylammonium perchlorate (0.7 g) and 2,2'-bithiophene (0.2 g) were dissolved in 100 ml of acetonitrile, after which ventilation was performed under a nitrogen gas stream for approximately 30 minutes to obtain a reaction solution. A counter electrode in the form of a platinum plate (1 cm×2 cm), a reference electrode in the form of an SCE, and the substrate having polypyrrole deposited thereon which was prepared in the previous step were immersed in the reaction solution. The polypyrrole film and the uncoated gold film were simultaneously used as working electrodes. While the reaction solution was cooled in ice water, under a nitrogen gas stream, first a voltage of 1 volt with respect to the SCE was applied to the working electrodes for 1 minute using a potentiostat, and then a constant current (30 microamperes) was passed between the working electrodes, which served as anodes, and the counter electrode for 3.5 minutes, and a semiconductor layer in the form of a polythiophene film (approximately 600 angstroms thick) was deposited on the polypyrrole film, on the gold film, and on the silicon dioxide therebetween.

Next, using a potentiostat, the potential of the working electrodes was maintained at 0 volts with respect to the SCE for 4 hours, and the amount of doping of the polypyrrole film and the polythiophene film was adjusted. Then, the substrate was washed two times with acetonitrile which had previously been deoxidized, was dried by blowing nitrogen gas thereon, and was then completely dried in a vacuum.

A portion (approximately 0.5 square cm) of the silicon dioxide on the opposite side of the silicon wafer, which did not have a polypyrrole or polythiophene film deposited thereon, was removed using sand paper. Ohmic contact was formed with the n-type silicon using an indium-gallium alloy, the indium-gallium alloy was coated with silver paste, a lead was connected to this contact point, the contact was secured using an epoxy resin, and the n-type silicon was processed so as to function as a gate through this lead.

In the above manner, an example of an FET having the structure shown in FIG. 3 was fabricated. In this example, the n-type silicon served as a combined substrate and gate and correspond to elements numbers 1 and 2 of FIG. 3. The silicon dixode film correspond to the electrically-insulating layer 3, the polythiophene film corresponded to the semiconductor layer 41, the polypyrrole film corresponded to element number 9 and served as a source or drain, one of the chromium films on which a gold film was formed corresponded to the lead 8, and the other chromium film on which a gold film was formed corresponded to element number 10 and served as a drain or source.

EXAMPLE 3

An FET was fabricated in a manner identical to that used for Example 2, after which it was heat treated in air at 120° C. for 24 hours.

COMPARATIVE EXAMPLE 2

An FET substrate was formed in exactly the same manner as in Comparative Example 1. First, 0.7 g of tetraethylammonium perchlorate and 0.2 g of 2,2'-bithiophene were added to 100 ml of acetonitrile, and ventilation was performed with nitrogen gas for 30 minutes to obtain a reaction solution. A counter electrode in the form of a platinum plate (1 cm×2 cm), a reference electrode in the form of an SCE, and the substrate which was prepared in the previous step were immersed in the reaction solution. The gold films which were to become a source and a drain served as working electrodes. The working electrodes were made anodes. While cooling the reaction solution in ice water, a constant current of 30 microamperes was passed between the working electrodes and the counter electrode for 3.5 minutes. A polythiophene film (approximately 600 angstroms thick) was deposited on both gold films as well as on the silicon dioxide therebetween. Next, using a potentiostat, the potential of the work electrodes was maintained at 0 volts with respect to the SCE for 4 hours, and the amount of doping of the polythiophene was adjusted. Next, the silicon wafer was washed two times with deoxidized acetonitrile, was dried by blowing nitrogen gas thereon, and was then completely dried in a vacuum. Thereafter, in the same manner as in Example 1, the n-type silicon was processed so as to function as a gate.

In the above manner, a comparative example of an FET having the structure illustrated in FIG. 2 was obtained. In this comparative example, the n-type silicon corresponded to the combined substrate and gate 7 of FIG. 2, the silicon dioxide film corresponded to the electrically-insulating film 3, the polythiophene film corresponded to the semiconductor layer 4, and the chromium films which were covered with gold corresponded to the source 5 and the drain 6, respectively.

COMPARATIVE EXAMPLE 3

An FET was prepared in the same manner as was Comparative Example 2, after which it was heat treated in air at 120° C. for 24 hours.

Figure 6:
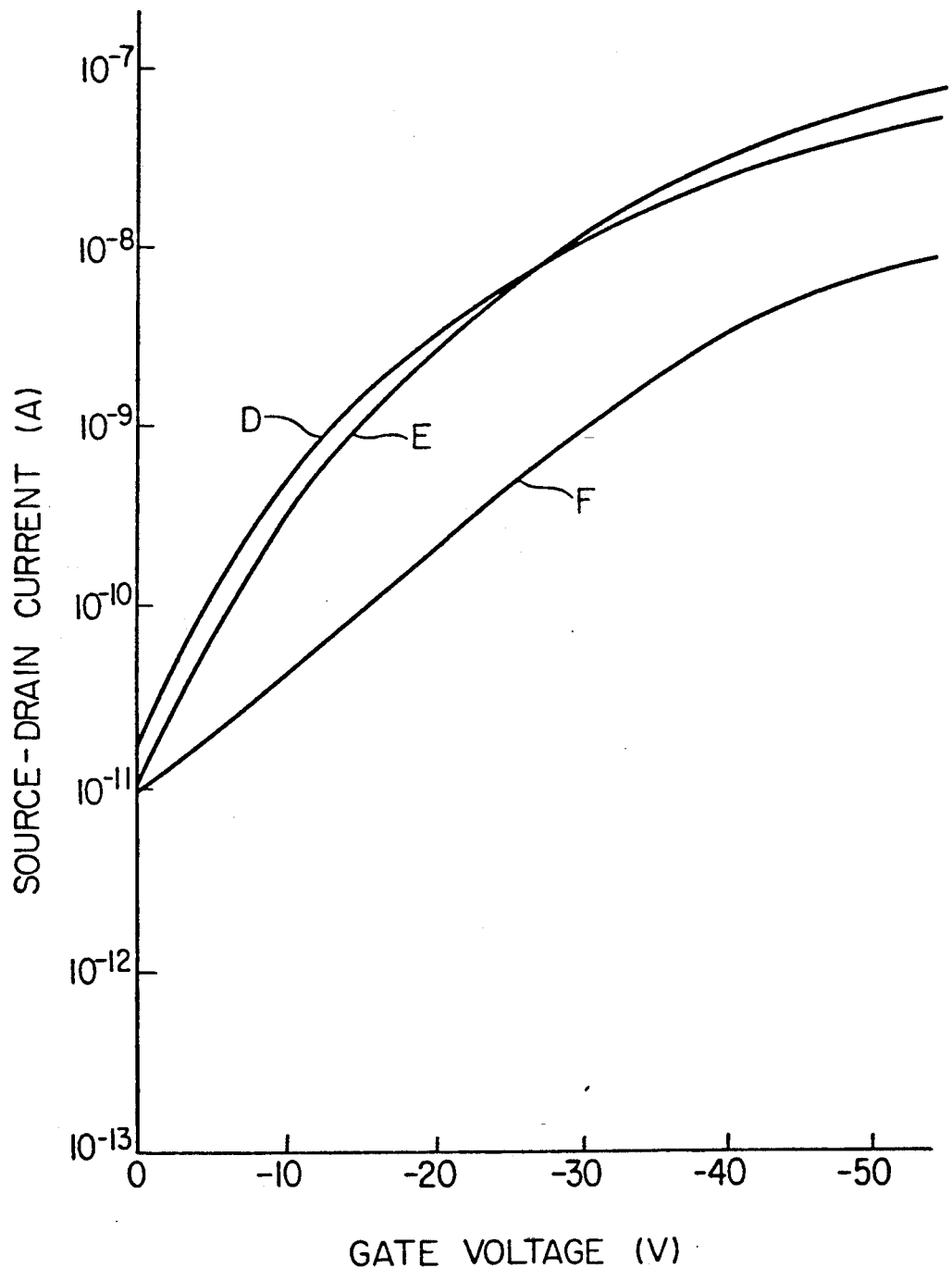

FIG. 6 is a graph of the relationship between the source-drain current and the gate voltage for Example 2 and Comparative Example 2 when a voltage of −30 volts was applied between the source and the drain. The horizontal axis indicates the gate voltage, and the vertical axis indicates the source-drain current. In FIG. 6, D is the curve for Example 2 of an FET when the polypyrrole film was used as a drain, E is the curve for Example 2 when the polypyrrole film was used as a source, and F is the curve for Comparative Example 2.

As is clear from FIG. 6, when the gate voltage was 0 volts, the source-drain currents were substantially the same for Example 2 and Comparative Example 2. However, as the gate voltage increased, the source-drain current for Example 2 rose far more rapidly than for Comparative Example 2. Thus, it was possible to greatly vary the source-drain current of Example 2 by changing the gate voltage.

Figure 7:
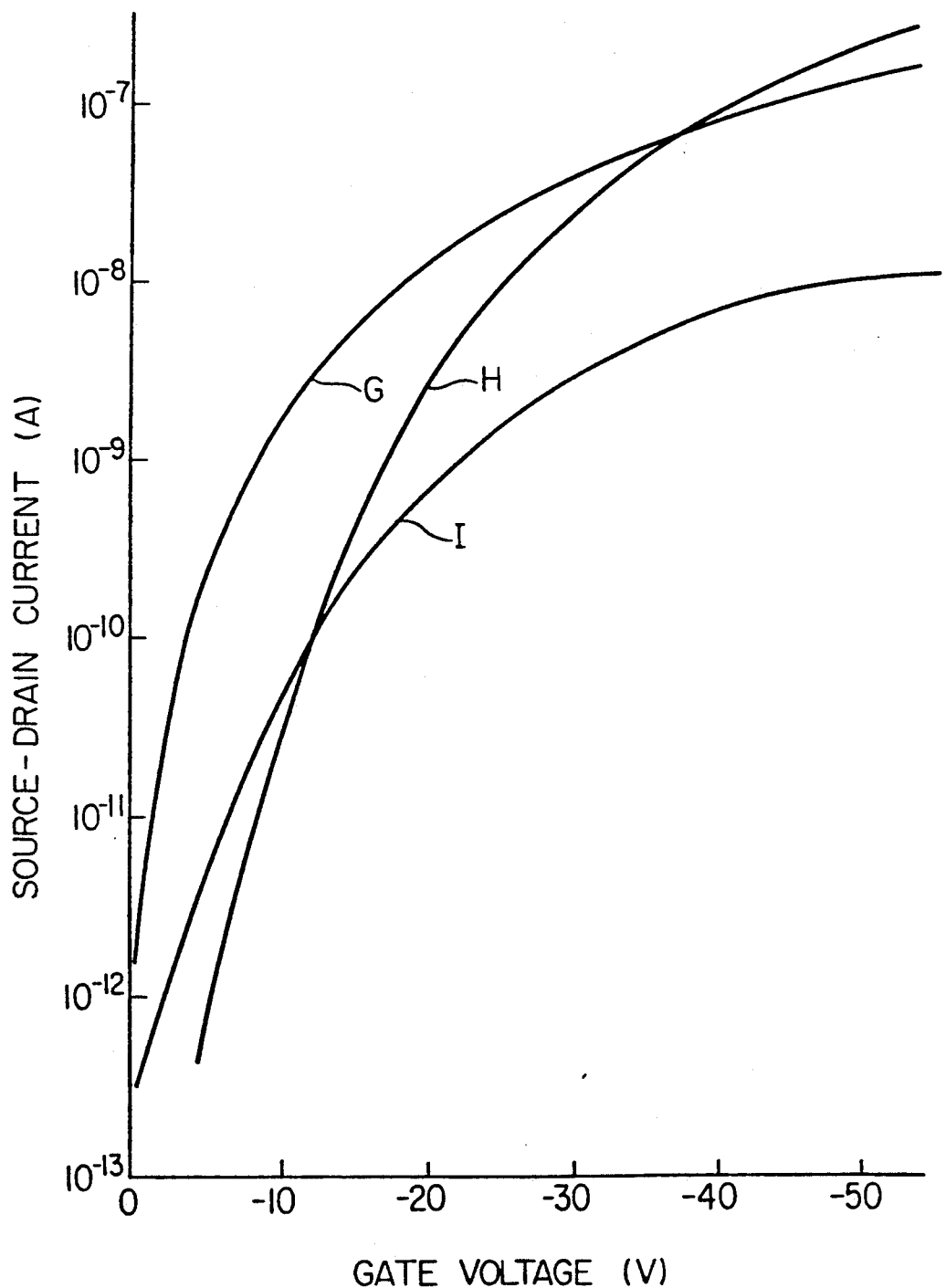

FIG. 7 is a graph of the relationship between the source-drain current and the gate voltage for Example 3 and Comparative Example 3 when a voltage of −30 volts was applied between the source and the drain. The horizontal axis indicates the gate voltage, and the vertical axis indicates the source-drain current. In FIG. 7, G is the curve for Example 3 of an FET when the polypyrrole film was used as a drain, H is the curve for Example 3 when the polypyrrole film was used as a source, and I is the curve for Comparative Example 3.

As is clear from FIG. 7, heat treatment in air produced absolutely no degradation in the properties of the present invention. Surprisingly, the properties of Example 3 were improved over those of Example 2, and it can be seen that the source-drain current could be greatly varied by the gate voltage.

EXAMPLE 4

A silicon dioxide film having a thickness of roughly 3000 angstroms was prepared by thermal oxidation on both sides of an n-type silicon wafer (3.0 cm×3.0 cm) having a thickness of 380 microns and an electrical conductance of 6 S/cm. Next, using a positive photoresist, two patterns for forming metal films which would serve as leads for a source and a drain (effective size of each pattern: 0.2 cm×0.8 cm, distance between patterns: 6 microns) were drawn on one side of the silicon wafer. A 200-angstrom chromium film was formed on this side, and a 300-angstrom gold film was formed atop the chromium film, both by vacuum deposition. The resist was then removed, and two gold films were formed which served as the leads for a source and a drain. A lead was connected to each gold film using silver paste, and the contact portions were secured with an epoxy resin, thereby obtaining an FET substrate.

Electrolytes (0.7 g) in the form of tetramethylammonium p-toluenesulfonate were added to 100 ml of acetonitrile, and ventilation was performed with nitrogen gas for approximately 40 minutes. After the electrolytes were completely dissolved, 0.4 ml of pyrrole were added to obtain a reaction solution. Working electrodes comprising both of the gold films formed on one side of the above-described silicon wafer, a counter electrode in the form of a platinum plate (1 cm×2 cm), and a reference electrode in the form of an SCE were immersed in the reaction solution. Under a nitrogen gas stream, a constant current of 60 microamperes was passed between the working electrodes, which served as anodes, and the counter electrode for 6 minutes. Polypyrrole films (approximately 4200 angstroms thick) which would become a source and a drain were deposited on the working electrodes only. After synthesis, the substrate was left to stand in an open circuit state for approximately 15 minutes and then removed from the reaction solution. It was then washed two times with acetonitrile which had previously been deoxidized, was dried by blowing nitrogen gas thereon, and then was stored in a vacuum.

Electrolytes in the form of tetraethylammonium perchlorate (0.7 g) and 2,2'-bithiophene (0.4 g) were dissolved in 100 ml of acetonitrile, after which ventilation was performed using nitrogen gas for approximately 30 minutes to obtain a reaction solution. A counter electrode in the form of a platinum plate (1 cm×2 cm), a reference electrode in the form of an SCE, and the substrate having polypyrrole deposited thereon which was prepared in the previous step were immersed in the reaction solution. The polypyrrole films which were to become a source and a drain were used as working electrodes. Under a nitrogen gas stream, first a voltage of 1 volt with respect to the SCE was applied to the working electrodes for 1 minute using a potentiostat. Then, a constant current (30 microamperes) was passed between the working electrodes, which served as anodes, and the counter electrode for 5 minutes, and a semiconductor layer in the form of a polythiophene film (approximately 850 angstroms thick) was deposited on the polypyrrole films and on the surface of the silicon dioxide film therebetween.

Next, using a potentiostat, the potential of the working electrodes was maintained at 0 volts with respect to the SCE for 4 hours, and the amount of doping of the polypyrrole film and the polythiophene film was adjusted. Then, the substrate was washed two times with acetonitrile which had previously been deoxidized, was dried by blowing nitrogen gas thereon, and was then completely dried in a vacuum.

A portion (approximately 0.5 square cm) of the silicon dioxide film on the opposite side of the silicon wafer, which did not have a polypyrrole or polythiophene film deposited thereon, was removed using sand paper. Ohmic contact was formed with the n-type silicon using an indium-gallium alloy, and a lead was connected to this contact point. The contact was secured using an epoxy resin, and the n-type silicon was made to function as a gate through this lead.

In the above manner, an example of an FET having the structure shown in FIG. 4 was prepared. In this example, the n-type silicon served as a combined substrate and gate and corresponded to elements 1 and 2 of FIG. 4. The silicon dioxide film corresponded to the electrically-insulating film 3, the polythiophene film corresponded to the semiconductor layer 42, the polypyrrole films corresponded to the source 9 and the drain 12, and the two chromium films on which the gold films were deposited corresponded to the leads 8 and 11.

EXAMPLE 5

An electrolyte in the form of 0.7 g of tetraethylammonium perchlorate was dissolved in 100 ml of acetonitrile, ventilation was performed with nitrogen gas for 30 minutes, and 0.4 ml of 3-methylthiophene were added to obtain a reaction solution. A counter electrode in the form of a platinum plate (1 cm×2 cm), a reference electrode in the form of an SCE, and a substrate which was prepared in the same manner as in Example 4 were immersed in the reaction solution. The gold films on the substrate which were to become leads for a source and a drain served as working electrodes. The working electrodes were made anodes, and under a nitrogen gas stream, a constant current of 60 microamperes was passed between the working electrodes and the counter electrode for 6 minutes. Poly(3-methylthiophene) films (approximately 3200 angstroms thick) which were to become a source and a drain were deposited on the working electrodes only. The substrate was then removed from the reaction solution, washed two times with deoxidized acetonitrile, dried by blowing nitrogen gas thereon, and stored in a vacuum.

Electrolytes in the form of tetraethylammonium perchlorate (0.7 g) and 2,2'-bithiophene (0.4 g) were dissolved in 100 ml of acetonitrile, after which ventilation was performed using nitrogen gas for approximately 30 minutes to obtain a reaction solution. A counter electrode in the form of a platinum plate (1 cm×2 cm), a reference electrode in the form of an SCE, and the substrate having poly(3-methylthiophene) films deposited thereon which was prepared in the previous step were immersed in the reaction solution. The poly(3-methylthiophene) films which were deposited on the gold films were used as working electrodes. Under a nitrogen gas stream, first a voltage of 0.9 volts with respect to the SCE was applied to the working electrodes for 1 minute using a potentiostat, and then a constant current (30 microamperes) was passed between the working electrodes, which were used as anodes, and the counter electrode for 7 minutes, and a semiconductor layer in the form of a polythiophene film (approximately 1200 angstroms thick) was deposited on the poly(3-methylthiophene) films and on the surface of the silicon dioxide film therebetween.

Next, using a potentiostat, the potential of the working electrodes was maintained at 0 volts with respect to the SCE for 4 hours, and the amount of doping of the poly(3-methylthiophene) films and the polythiophene film was adjusted. Then, the silicon wafer was washed two times with acetonitrile which had previously been deoxidized, was dried by blowing nitrogen gas thereon, and was then completely dried in a vacuum.

A portion (approximately 0.5 square cm) of the silicon dioxide film on the opposite side of the silicon wafer, which did not have a poly(3-methylthiophene) or polythiophene film deposited thereon, was removed using sand paper. Ohmic contact was formed with the n-type silicon using an indium-gallium alloy, a lead was connected to this contact point, the contact was secured using an epoxy resin, and the n-type silicon was made to function as a gate through this lead.

In the above manner, an example of an FET having the structure shown in FIG. 4 was prepared. In Example 5, the n-type silicon served as a combined substrate and gate and corresponded to elements numbers 1 and 2 of FIG. 4. The silicon dioxide film corresponded to the electrically-insulating film 3, the polythiophene film corresponded to the semiconductor layer 42, the poly(3-methylthiophene) films corresponded to the source 9 and the drain 12, and the chromium films on which the gold films were formed corresponded to the leads 8 and 11 for the source and the drain.

COMPARATIVE EXAMPLE 4

An FET substrate was formed in the same manner as in Example 4. However, the gold films which served as the leads for the source and the drain of Example 4 were used as the source and the drain themselves.

Next, 0.7 g of tetraethylammonium perchlorate and 0.4 g of 2,2'-bithiophene were added to 100 ml of acetonitrile, and ventilation was performed with nitrogen gas for 30 minutes to obtain a reaction solution. A counter electrode in the form of a platinum plate (1 cm×2 cm), a reference electrode in the form of an SCE, and the substrate which was prepared in the previous step were immersed in the reaction solution. The gold films which were to become a source and a drain served as working electrodes. The working electrodes were made anodes. A constant current of 30 microamperes was passed between the working electrodes and the counter electrode for 5 minutes, and a polythiophene film (approximately 850 angstroms thick) was deposited on both gold films as well as on the silicon dioxide film therebetween.

Next, using a potentiostat, the potential of the working electrodes was maintained at 0 volts with respect to the SCE for 4 hours, and the amount of doping of the polythiophene film was adjusted. Next, the substrate was removed from the reaction solution, washed two times with deoxidized acetonitrile, dried by blowing nitrogen gas thereon, and then completely dried in a vacuum. Thereafter, in the same manner as in Examples 4 and 5, the n-type silicon was processed so as to function as a gate.

In the above manner, a comparative example of an FET having the structure illustrated in FIG. 2 was obtained. In this comparative example, the n-type silicon corresponded to the combined substrate and gate 7 of FIG. 2, the silicon dioxide film corresponded to the electrically-insulating film 3, the polythiophene film corresponded to the semiconductor layer 4, and the chromium films which were covered with gold films corresponded to the source 5 and the drain 6.

Figure 8:
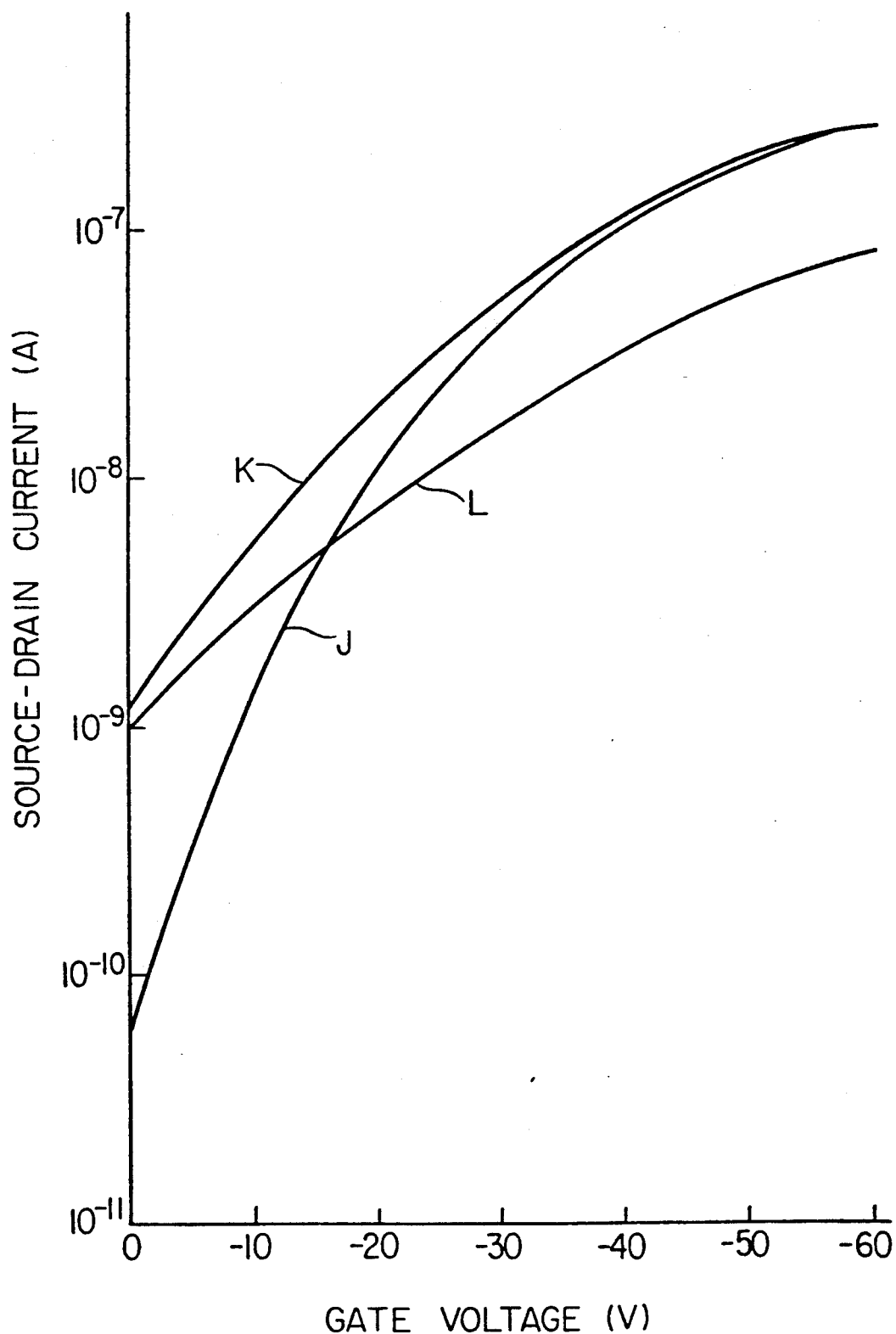

FIG. 8 is a graph showing the relationship between the source-drain current and the gate voltage for Example 4, Example 5, and Comparative Example 4 of a field-effect transistor when a voltage of $-30$ volts was applied between the source and the drain. The horizontal axis indicates the gate voltage (V) and the vertical axis indicates the source-drain current (A). In FIG. 8, J is the curve for Example 4, K is the curve for Example 5, and L is the curve for Comparative Example 4 of an FET. As is clear from FIG. 8, the variation of the source-drain current with the gate voltage was much greater for Examples 4 and 5 than for Comparative Example 4, and a great improvement in characteristics can be seen.

Examples 4 and 5 of an FET were left in air for one month, but no degradation could be observed in their properties.

EXAMPLE 6

An FET substrate was prepared in exactly the same manner as for Example 4. Next, electrolytes (0.7 g) in the form of tetramethylammonium p-toluenesulfonate were added to 100 ml of acetonitrile, and ventilation was performed with nitrogen gas for approximately 40 minutes. After the electrolytes were completely dissolved, 0.4 ml of pyrrole were added to obtain a reaction solution. Working electrodes comprising the gold films formed on one side of the above-described silicon wafer, a counter electrode in the form of a platinum plate (1 cm×2 cm), and a reference electrode in the form of an SCE were immersed in the reaction solution. While cooling the reaction solution with ice water, under a nitrogen gas stream, a constant current of 60 microamperes was passed between the working electrodes, which served as anodes, and the counter electrode for 7 minutes. Two polypyrrole films (approximately 5000 angstroms thick) which would become a source and a drain were deposited on the working electrodes only. After synthesis, the substrate was left to stand in an open circuit state for approximately 15 minutes, after which it was removed from the reaction solution. It was then washed two times with acetonitrile which had previously been deoxidized, was dried by blowing nitrogen gas thereon, and then was stored in a vacuum.

Electrolytes in the form of tetraethylammonium perchlorate (0.7 g) and 2,2'-bithiophene (0.4 g) were dissolved in 100 ml of acetonitrile, after which ventilation was performed using nitrogen gas for approximately 30 minutes to obtain a reaction solution. A counter electrode in the form of a platinum plate (1 cm×2 cm), a reference electrode in the form of an SCE, and the substrate having polypyrrole deposited thereon which was prepared in the previous step were immersed in the reaction solution. The polypyrrole films which were to become a source and a drain were used as working electrodes. While cooling the reaction solution with ice water, under a nitrogen gas stream, first a voltage of 1 volt with respect to the SCE was applied to the working electrodes for 1 minute using a potentiostat. Then, a constant current (30 microamperes) was passed between the working electrodes, which served as anodes, and the counter electrode for 3.5 minutes, and a semiconductor layer in the form of a polythiophene film (approximately 600 angstroms thick) was deposited on the polypyrrole films and on the surface of the silicon dioxide film therebetween.

Next, using a potentiostat, the potential of the working electrodes was maintained at 0 volts with respect to the SCE for 4 hours, and the amount of doping of the polypyrrole and polythiophene films was adjusted. Then, the substrate was washed two times with acetonitrile which had previously been deoxidized, was dried by blowing nitrogen gas thereon, and was then completely dried in a vacuum.

A portion (approximately 0.5 square cm) of the silicon dioxide film on the opposite side of the silicon wafer, which did not have a polypyrrole or a polythiophene film deposited thereon, was removed using sand paper. Ohmic contact was formed with the n-type silicon using an indium-gallium alloy, the indium-gallium alloy was coated with silver paste, a lead was connected to the contact point, the contact was secured using an epoxy resin, and the n-type silicon was made to function as a gate through this lead.

The resulting FET was heat treated in air at 120° C. for 24 hours.

In the above manner, an example of an FET having the structure shown in FIG. 4 was prepared. In this example, the n-type silicon served as a combined substrate and gate and corresponded to elements 1 and 2 of FIG. 4. The silicon dioxide film corresponded to the electrically-insulating film 3, the polythiophene film corresponded to the semiconductor layer 42, the polypyrrole films corresponded to the source 9 and the drain 12, and the chromium films on which the gold films were formed corresponded to the leads 8 and 11 for the source and the drain.

COMPARATIVE EXAMPLE 5

An FET substrate was prepared in the same manner as in Example 6. However, the gold films which served as the leads for the source and the drain of Example 6 were used as the source and the drain themselves.

Next, 0.7 g of tetraethylammonium perchlorate and 0.4 g of 2,2'-bithiophene were added to 100 ml of acetonitrile, and ventilation was performed with nitrogen gas for 30 minutes to obtain a reaction solution. A counter electrode in the form of a platinum plate (1 cm×2 cm), a reference electrode in the form of an SCE, and the substrate which was prepared in the previous step were immersed in the reaction solution. The gold films which were to become a source and a drain served as working electrodes. The working electrodes were made anodes. While cooling the reaction solution with ice water, a constant current of 30 microamperes was passed between the working electrodes and the counter electrode for 5 minutes, and a polythiophene film (approximately 600 angstroms thick) was deposited on both gold films as well as on the silicon dioxide film therebetween. Next, using a potentiostat, the potential of the working electrodes was maintained at 0 volts with respect to the SCE for 4 hours, and the amount of doping of the polythiophene film was adjusted. Next, the silicon wafer was washed two times with deoxidized acetonitrile, was dried by blowing nitrogen gas thereon, and was then completely dried in a vacuum. Thereafter, in the same manner as in Example 6, the n-type silicon was processed so as to function as a gate. The resulting FET was heat treated in air at 120° C. for 24 hours.

In the above manner, a comparative example of an FET having the structure illustrated in FIG. 2 was obtained. In this comparative example, the n-type silicon corresponded to the substrate and gate 7 of FIG. 2, the silicon dioxide film corresponded to the electrically-insulating film 3, the polythiophene film corresponded to the semiconductor layer 4, and the chromium films which were covered with the gold films corresponded to the source 5 and the drain 6.

Figure 9:
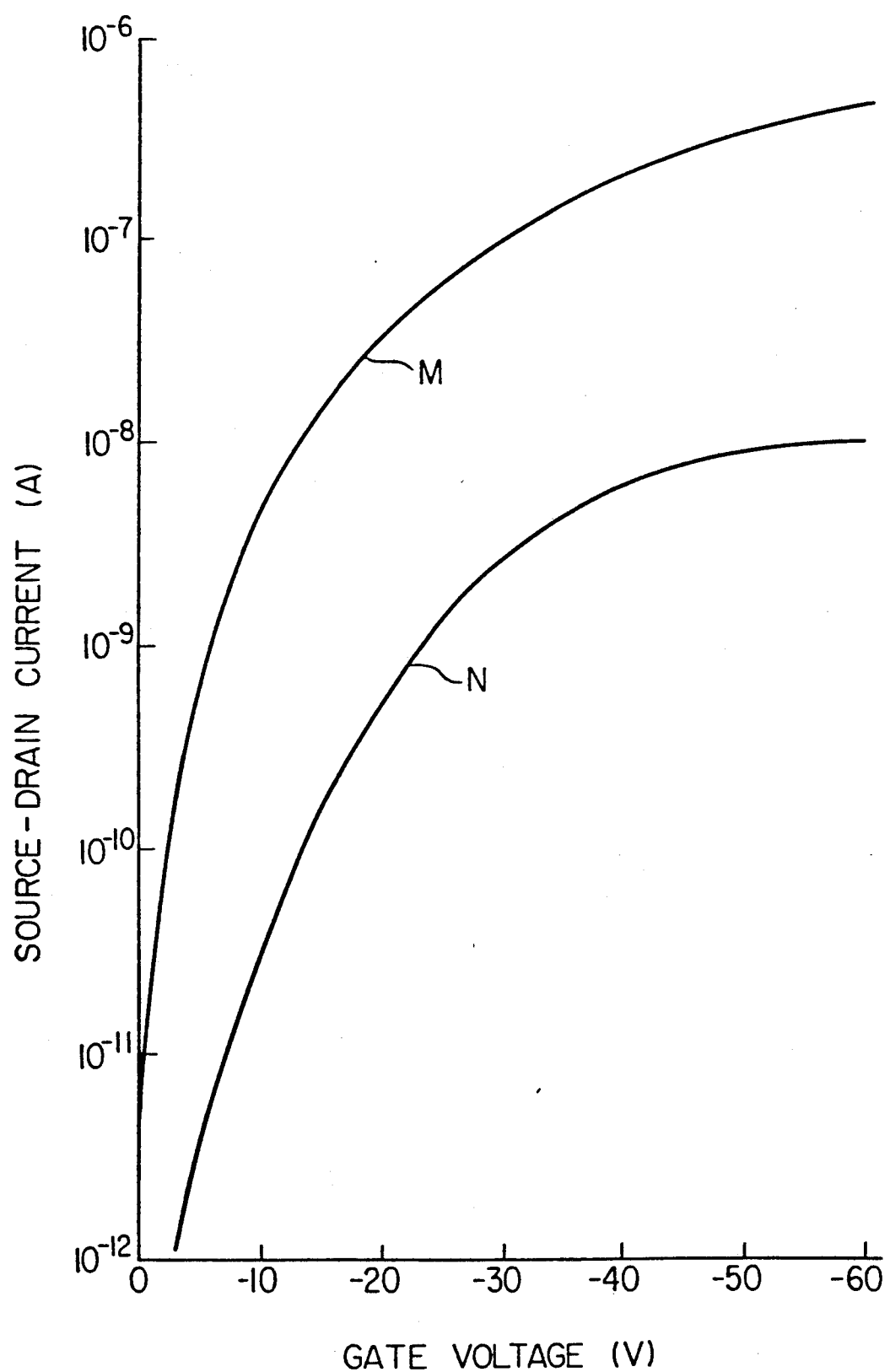

FIG. 9 is a graph showing the relationship between the source-drain current and the gate voltage for Example 6 and Comparative Example 5 of a field effect transistor when −30 volts were applied between the source and the drain. The horizontal axis indicates the gate voltage (V) and the vertical axis indicates the source-drain current (A). In FIG. 9, M is the curve for Example 6, and N is the curve for Comparative Example 5 of an FET. As is clear from FIG. 9, even though Example 6 was subjected to heat treatment in air, it underwent no degradation, the variation of the source-drain current by the gate voltage was much greater than for Comparative Example 5, and a remarkable improvement in characteristics can be seen.

While a number of examples of the present invention have been described herein, it will be apparent to those skilled in the art that various modifications thereof can be made without departing from the scope of the invention as defined in the following claims.

What is claimed is:

1. A field-effect transistor comprising:
   a source;
   a drain;
   a semiconductor layer which adjoins said source and said drain and which acts as a current pathway therebetween;
   an electrically-insulating layer which adjoins said source, said drain, and said semiconductor layer; and
   a gate which is disposed on the opposite side of said electrically-insulating layer from said semiconductor layer, the conductance of said semiconductor layer being controlled by the voltage of said gate, wherein at least one of said source and said drain comprises a film of a first π-conjugated polymer, and said semiconductor layer comprises a film of a second π-conjugated polymer which differs from said first π-conjugated polymer.

2. A field-effect transistor as claimed in claim 1, wherein only one of said source and said drain comprises a film of said first π-conjugated polymer.

3. A field-effect transistor as claimed in claim 2, wherein one of said source and said drain comprises a film of said first π-conjugated polymer, and said other of said source and said drain comprises a metal film.

4. A field-effect transistor as claimed in claim 1, wherein both said source and said drain comprise a film of said first π-conjugated polymer.

5. A field-effect transistor as claimed in claim 1, further comprising a lead in the form of a metal film which is disposed between said electrically-insulating layer and at least one of said source and said drain.

6. A field-effect transistor as claimed in claim 1, wherein at least one of said first and said second π-conjugated polymers is a π-conjugated polymer comprising five-membered heterocyclic rings.

7. A field-effect transistor as claimed in claim 6, wherein the structural formula of said π-conjugated polymer comprising five-membered heterocyclic rings is

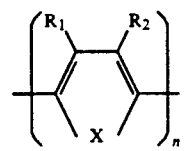

wherein X is selected from S and O, R1 and R2 are each one substance selected from —H, —CH3, —OCH3, —C2H5, and —OC2H5, and n is an integer.

8. A field-effect transistor as claimed in claim 6, wherein the structural formula of said π-conjugated polymer comprising five-membered heterocyclic rings is

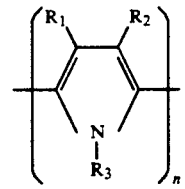

wherein R1 and R2 are each one substance selected from —H, —CH3, —OCH3, —C2H5, and —OC2H5, R3 is one substance selected from —H, —CH3, —C2H5, —C3H7,

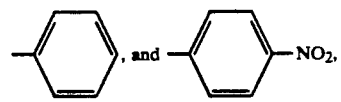

and n is an integer.

9. A field-effect transistor as claimed in claim 7, wherein said π-conjugated polymer comprising five-membered heterocyclic rings is polythiophene or poly(3-methylthiophene).

10. A field-effect transistor as claimed in claim 8, wherein said π-conjugated polymer comprising five-membered heterocyclic rings is polypyrrole or poly(N-methylpyrrole).

11. A field-effect transistor as claimed in claim 6, wherein said first π-conjugated polymer comprises polypyrrole, and said second π-conjugated polymer comprises polythiophene.

12. A field-effect transistor as claimed in claim 6, wherein said first π-conjugated polymer comprises poly(3-methylthiophene), and said second π-conjugated polymer comprises polythiophene.

13. A field-effect transistor as claimed in claim 1, wherein at least one of said first and second π-conjugated polymers is formed by electrochemical polymerization.

14. A field-effect transistor as claimed in claim 1, wherein at least one of said first and second π-conjugated polymers is subjected to doping.

15. A field-effect transistor as claimed in claim 14, wherein said doping is electrochemically performed.

16. A field-effect transistor as claimed in claim 9, wherein said polythiophene is obtained by electrochemical polymerization of 2,2'-bithiophene.

17. A field-effect transistor as claimed in claim 1, wherein said gate comprises one substance selected from p-type silicon and n-type silicon.

18. A field-effect transistor as claimed in claim 1, further comprising a substrate which is disposed beneath said electrically-insulating layer.

19. A field-effect transistor as claimed in claim 1, wherein said gate comprises one substance selected from p-type silicon and n-type silicon, and said gate serves as both a gate and a substrate for said field-effect transistor.

20. A field-effect transistor comprising:
a source;
a drain;
a semiconductor layer which adjoins said source and said drain and which acts as a current pathway therebetween;
an electrically-insulating layer which adjoins said source, said drain, and said semiconductor layer; and
a gate which is disposed on the opposite side of said electrically-insulating layer from said semiconductor layer, the conductance of said semiconductor layer being controlled by the voltage of said gate, wherein said source comprises a film of a first π-conjugated polymer, said semiconductor layer comprises a film of a second π-conjugated polymer which differs from said first π-conjugated polymer, and said drain comprises a film of a third π-conjugated polymer which differs from said second π-conjugated polymer.

21. A field-effect transistor as claimed in claim 20, further comprising a lead in the form of a metal film which is disposed between said electrically-insulating layer and at least one of said source and said drain.

22. A field-effect transistor as claimed in claim 20, wherein at least one of said first, said second, and said third π-conjugated polymers is a π-conjugated polymer comprising five-membered heterocyclic rings.

23. A field-effect transistor as claimed in claim 22, wherein the structural formula of said π-conjugated polymer comprising five-membered heterocyclic rings is

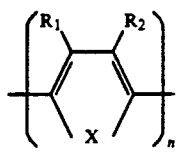

wherein X is selected from S and O, R1 and R2 are each one substance selected from —H, —CH3, —OCH3, —C2H5, and —OC2H5, and n is an integer.

24. A field-effect transistor as claimed in claim 22, wherein the structural formula of said π-conjugated polymer comprising five-membered heterocyclic rings is

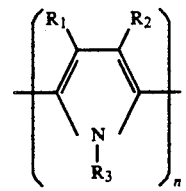

wherein R1 and R2 are each one substance selected from —H, —CH3, —OCH3, —C2H5, and —OC2H5, R3 is one substance selected from —H, —CH3, —C2H5, —C3H7,

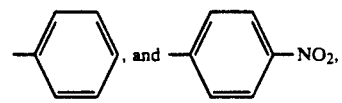

and n is an integer.

25. A field-effect transistor as claimed in claim 23, wherein said π-conjugated polymer comprising five-membered heterocyclic rings is polythiophene or poly(3-methylthiophene).

26. A field-effect transistor as claimed in claim 24, wherein said π-conjugated polymer comprising five-membered heterocyclic rings is polypyrrole or poly(N-methylpyrrole).

27. A field-effect transistor as claimed in claim 22, wherein said first and said third π-conjugated polymers comprise polypyrrole, and said second π-conjugated polymer comprises polythiophene.

28. A field-effect transistor as claimed in claim 22, wherein said first and said third π-conjugated polymers comprise poly(3-methylthiophene), and said second π-conjugated polymer comprises polythiophene.

29. A field-effect transistor as claimed in claim 20, wherein at least one of said first, second, and third π-conjugated polymers is formed by electrochemical polymerization.

30. A field-effect transistor as claimed in claim 20, wherein at least one of said first, second, and third π-conjugated polymers is subjected to doping.

31. A field-effect transistor as claimed in claim 30, wherein said doping is electrochemically performed.

32. A field-effect transistor as claimed in claim 25, wherein said polythiophene is obtained by electrochemical polymerization of 2,2'-bithiophene.

33. A field-effect transistor as claimed in claim 20, wherein said gate comprises one substance selected from p-type silicon and n-type silicon.

34. A field-effect transistor as claimed in claim 20, further comprising a substrate which is disposed beneath said electrically-insulating layer.

35. A field-effect transistor as claimed in claim 20, wherein said gate comprises one substance selected from p-type silicon and n-type silicon, and said gate serves as both a gate and a substrate for said field-effect transistor.

* * * * *